United States Patent [19]

Davis

[11] 4,072,931

[45] Feb. 7, 1978

[54] RADIO FREQUENCY ALARM SYSTEM INCLUDING TRANSMITTING, CODING AND DECODING CIRCUITRY

[75] Inventor: Glenn A. Davis, Lilburn, Ga.

[73] Assignee: Scientific-Atlanta, Inc., Atlanta, Ga.

[21] Appl. No.: 710,154

[22] Filed: July 30, 1976

Related U.S. Application Data

[62] Division of Ser. No. 618,239, Sept. 30, 1975.

[51] Int. Cl.² .......................... H03D 3/00; H03K 1/16

[52] U.S. Cl. ............................ 340/171 R; 179/84 VF; 307/233 R; 328/140; 329/107

[58] Field of Search ............... 340/171 R, 168, 167 R; 329/107; 328/140; 307/233 R; 179/84 VF

[56] References Cited

U.S. PATENT DOCUMENTS

| | | | |
|---|---|---|---|
| 3,548,322 | 12/1970 | James | 328/140 |
| 3,825,842 | 7/1974 | Birchfield | 328/140 X |
| 3,986,055 | 10/1976 | Barzely | 307/233 R X |

*Primary Examiner*—Donald J. Yusko

*Attorney, Agent, or Firm*—Cushman, Darby & Cushman

[57] ABSTRACT

At least one component of a transmitted RF alarm signal is repetitively shifted in frequency between at least first and second frequencies chosen from among a plurality of predetermined frequencies with such shifts in frequency occurring at a predetermined switching rate. A remotely located alarm receiver detects the presence of the predetermined first and second frequencies as well as the presence of the predetermined switching rate therebetween before producing a corresponding alarm output only if both of the predetermined frequencies and the predetermined switching rate therebetween are all concurrently present. Special transmitting circuitry including encoding modulator circuitry is provided. Special decoding circuitry for incorporation at the remotely located receiver of such a system is also provided. The exemplary embodiment of such decoding circuitry incorporates a unique frequency detection circuitry which greatly increases the flexibility and reliability of the overall system.

9 Claims, 5 Drawing Figures

RADIO FREQUENCY ALARM SYSTEM INCLUDING TRANSMITTING, CODING AND DECODING CIRCUITRY

This invention generally relates to alarm systems and components for use therein. The alarm system of this invention is of the general type which includes a plurality of remotely located alarm sensing and transmitting units cooperating with at least one central receiving station. When remotely activated by one of the alarm sensing and transmitting units, such central receiving station provides an appropriate alarm output which may simply signal the location and type of alarm that has occurred and/or which may itself take some definitive action such as by dialing a predetermined telephone connection and transmitting appropriate information thereto.

This general type of alarm system is well known in the art as are various types of conventional components for achieving such general overall operation. For instance, reference may be had to earlier issued U.S. Pat. Nos. 3,757,315 and 3,825,842 both of which are commonly assigned herewith. Reference may also be had to earlier issued U.S. Pat. Nos. 3,149,317 and/or 3,230,454 wherein different tone modulations are applied to an RF carrier from a remotely located alarm sensing and transmitting site to a central station. The modulation tone is then detected and decoded at the central station to provide an output alarm indication of the location and/or type of alarm that has occurred.

While straightforward tone modulation of an RF carrier may be successfully utilized in some types of radio alarm systems under some conditions, it is often desirable or even necessary to provide increased system security from spurious and/or ambient radio frequency signals which might unintentionally otherwise trip the alarm system at the central receiving site.

The multiple level coding scheme incorporated in the system of the present invention has been discovered to provide a particularly high degree of immunity from such spurious and unwanted responses. At the same time, the system of this invention has been discovered to constitute a considerable simplification and hence cost saving over prior radio frequency alarm systems of accepted usage such as, for example, the frequency diversity RF alarm systems as exemplified in the aforementioned U.S. Pat. No. 3,757,315 which requires additional and/or more complex radio transmitting and receiving circuitry than the present invention.

In the presently preferred exemplary embodiment of this invention, an RF carrier is modulated by a signal which is shifted in frequency between at least first and second frequencies chosen from among a plurality of predetermined frequencies. Additionally, the switching rate between such shifts in modulation frequencies occur at a predetermined switching rate which switching rate may itself be chosen from among a plurality of predetermined possible switching rates. Such a modulation component is recovered from the RF carrier at the central receiving site and a decoder processes such modulation to detect the presence of at least two predetermined first and second modulation frequencies and the switching rate therebetween. A corresponding alarm output is produced only if both the first and second predetermined modulation frequencies are alternately present and only if the predetermined switching rate therebetween is present.

In the exemplary embodiment, such incoming modulation component of the RF carrier is amplified and pulse shaped into a corresponding train of relatively short pulses having a pulse repetition rate or frequency which is the same as the frequency of the incoming modulation component. This pulse train is then presented to a bank of frequency detectors which provide respectively corresponding outputs only when the repetition rate or frequency of the input pulse train occurs within a predetermined frequency band corresponding to that particular detector. The outputs of the detectors are also compared to produce yet another pulse train of relatively narrow pulses having a repetition rate or frequency corresponding to the switch rate at which the input modulation switches between two of the predetermined frequencies. This latter generated pulse train is, in turn, presented to another bank of frequency detectors which provide respectively corresponding outputs only when the repetition rate or frequency of the input pulse train thereto falls within a corresponding predetermined band of frequencies. The outputs from these first and second banks of frequency detectors are then logically combined to provide corresponding outputs on various output channels where each output channel corresponds to a particular combination of modulation frequencies and to a particular switching rate therebetween.

Such a system as this is almost totally immune from spurious or unintended alarm outputs since three different distinct characteristics of modulation on any given carrier frequency must be present in order to trip the alarm on any particular channel output. The chances that any given carrier frequency will be spuriously modulated so as to repetitively shift at a particular predetermined rate between two particular predetermined modulation frequencies is indeed remote.

The preferred exemplary embodiment to be described in detail below also incorporates a unique form of frequency detector which is especially useful in this alarm system. For example, this form of frequency detector does not respond to harmonics of its designed frequency selection band thereby permitting the use of harmonically related modulation frequencies in this system. Furthermore, the frequency detector of this exemplary embodiment is especially adapted to insure appropriate outputs therefrom in the absence of inputs thereto and quickly changes its output if even so much as a single input pulse occurs outside its designed frequency select band. Futhermore, this form of frequency detector is inhibited from changing its output to a selected status until the input pulse train thereto has been present for a predetermined period of time with an appropriate pulse repetition rate or frequency within the frequency select band. This type of frequency detector and various features thereof are believed to have merit in their own right as an improved form of frequency detector.

The exemplary embodiment of the frequency detector of this invention includes two input comparators which are caused to toggle or not toggle as a function of the frequency or repetition rate of the input pulse trains thereto. A first one of the comparators toggles both within the frequency select band and therebelow while a second one of the comparators toggles only below the frequency select band. The output of these first two comparators is then presented to further comparator circuitry which detects the occurrence of the desired condition, namely, when the first comparator is toggling and the second comparator is not toggling whereupon an output indication is provided to indicate that the input pulse train is occurring at a frequency within the frequency select band of the detector. The final comparator of the detecting circuitry is also arranged to provide an appropriate non-select output even when there is no input at all to the frequency detector and/or whenever as much as a single pulse is missed from an input pulse train and/or until a predetermined time period has elapsed after presentation of a pulse train having a frequency within the frequency select band of the frequency detector.

The radio frequency transmitter of the preferred exemplary embodiment is also believed to have special merit. Its modulator includes a first oscillator capable of operating at either of first or second modulation frequencies depending upon the state of a switched input thereto and a second oscillator which operates at a predetermined rate so as to provide the necessary switched input to the first oscillator thereby causing the radiated RF carrier to be modulated alternately at first and second frequencies and at a predetermined switching rate therebetween. These as well as other objects and features of the present invention will be more completely understood from the following detailed description taken in conjunction with the accompanying drawings, of which:

Figure 1:
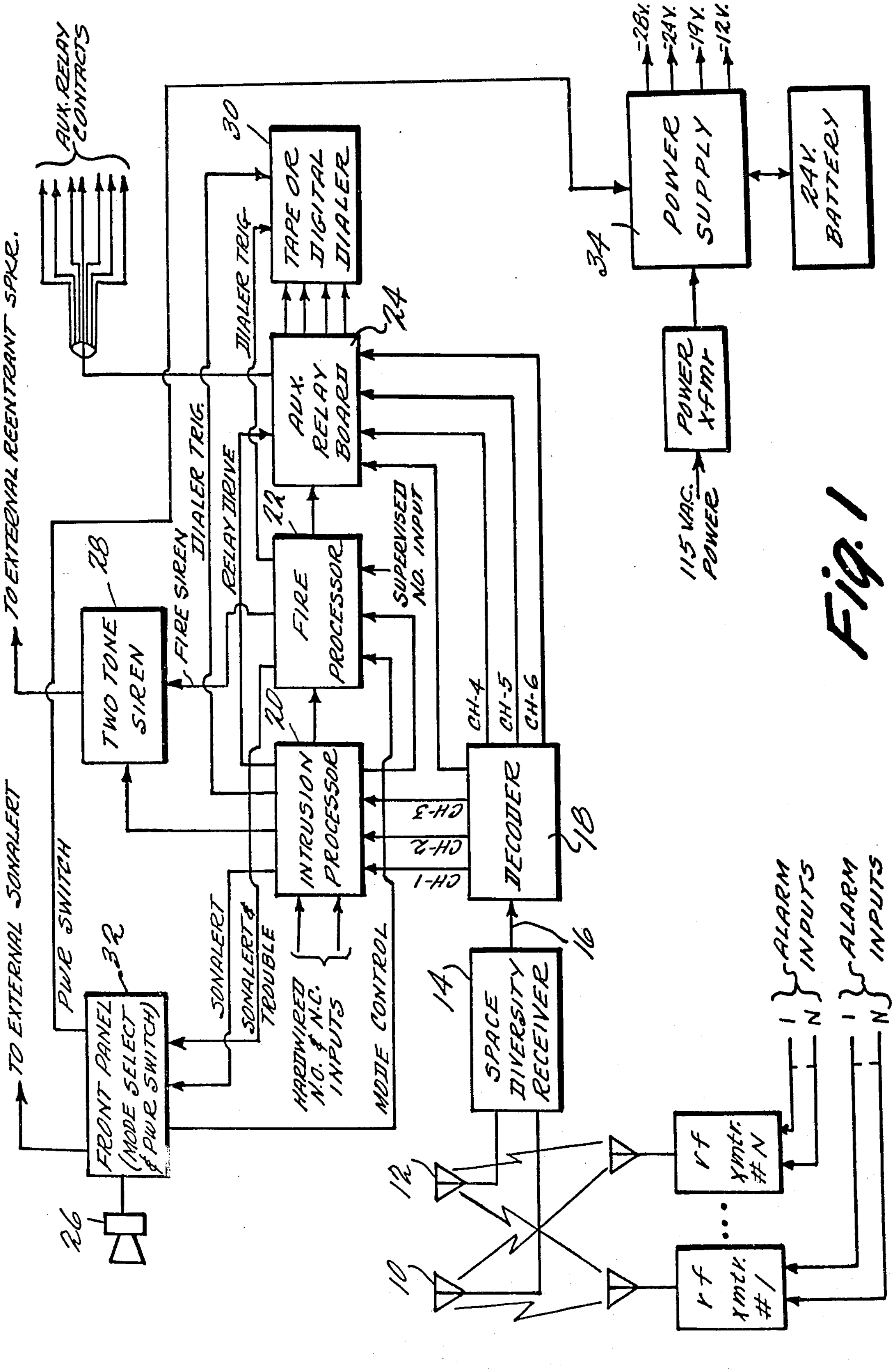
FIG. 1 is a block diagram of an exemplary overall radio frequency alarm system according to this invention.
Figure 2:
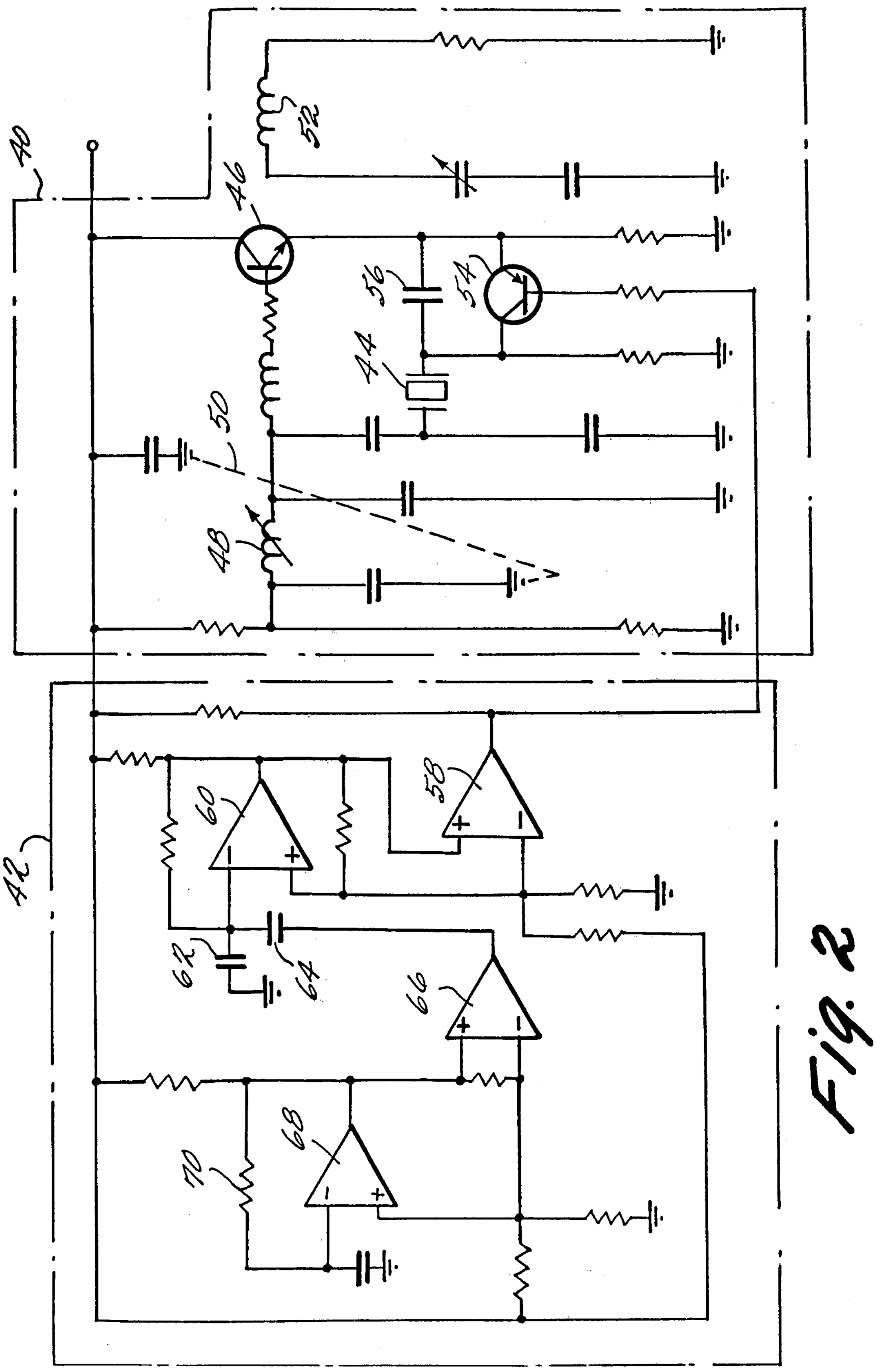
FIG. 2 is a schematic diagram of exemplary transmitting and modulation circuitry according to this invention as utilized in the system of FIG. 1.
Figure 3:
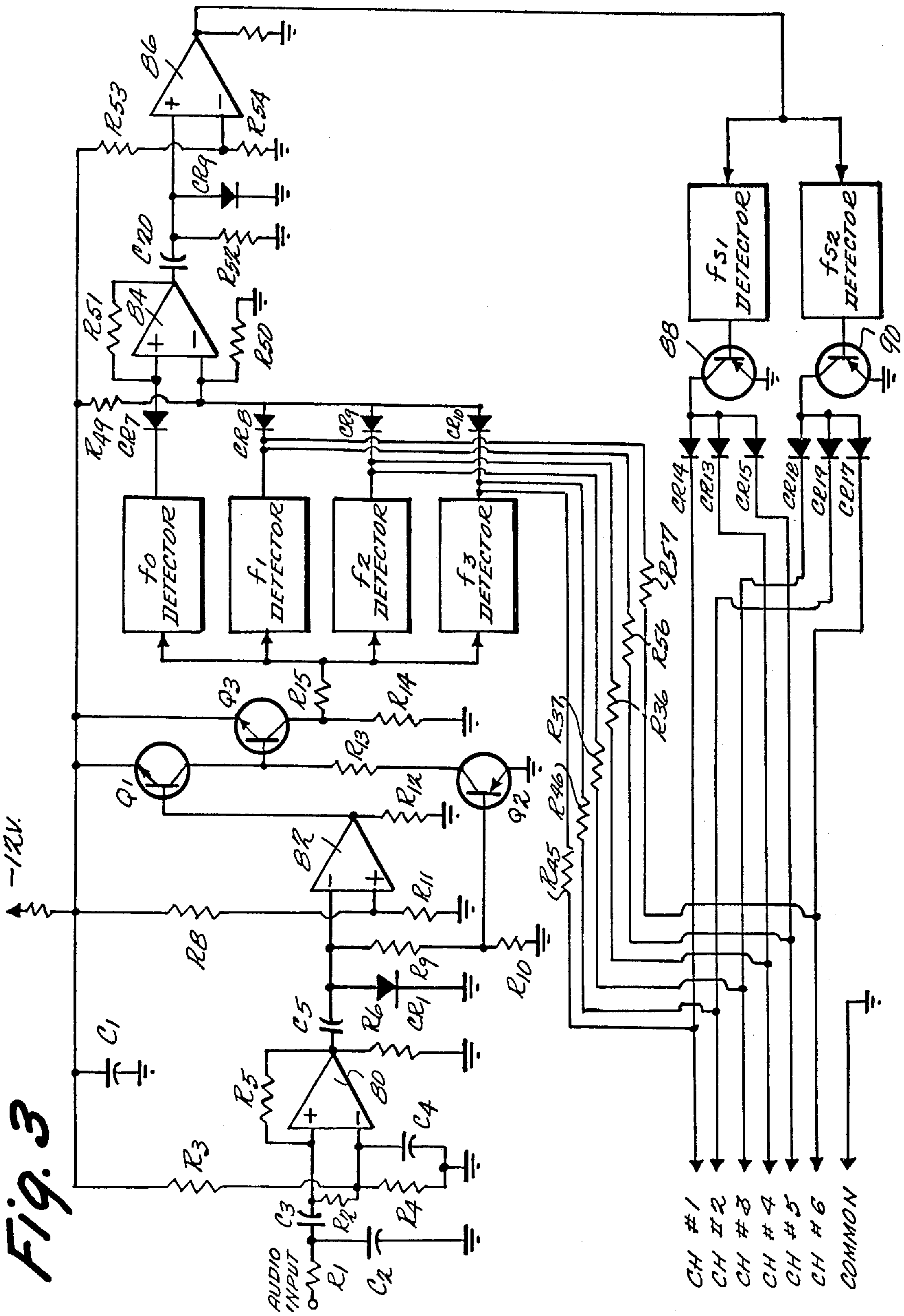
FIG. 3 is a schematic diagram of exemplary decoding circuitry according to this invention as employed in the system of FIG. 1.
Figure 4:
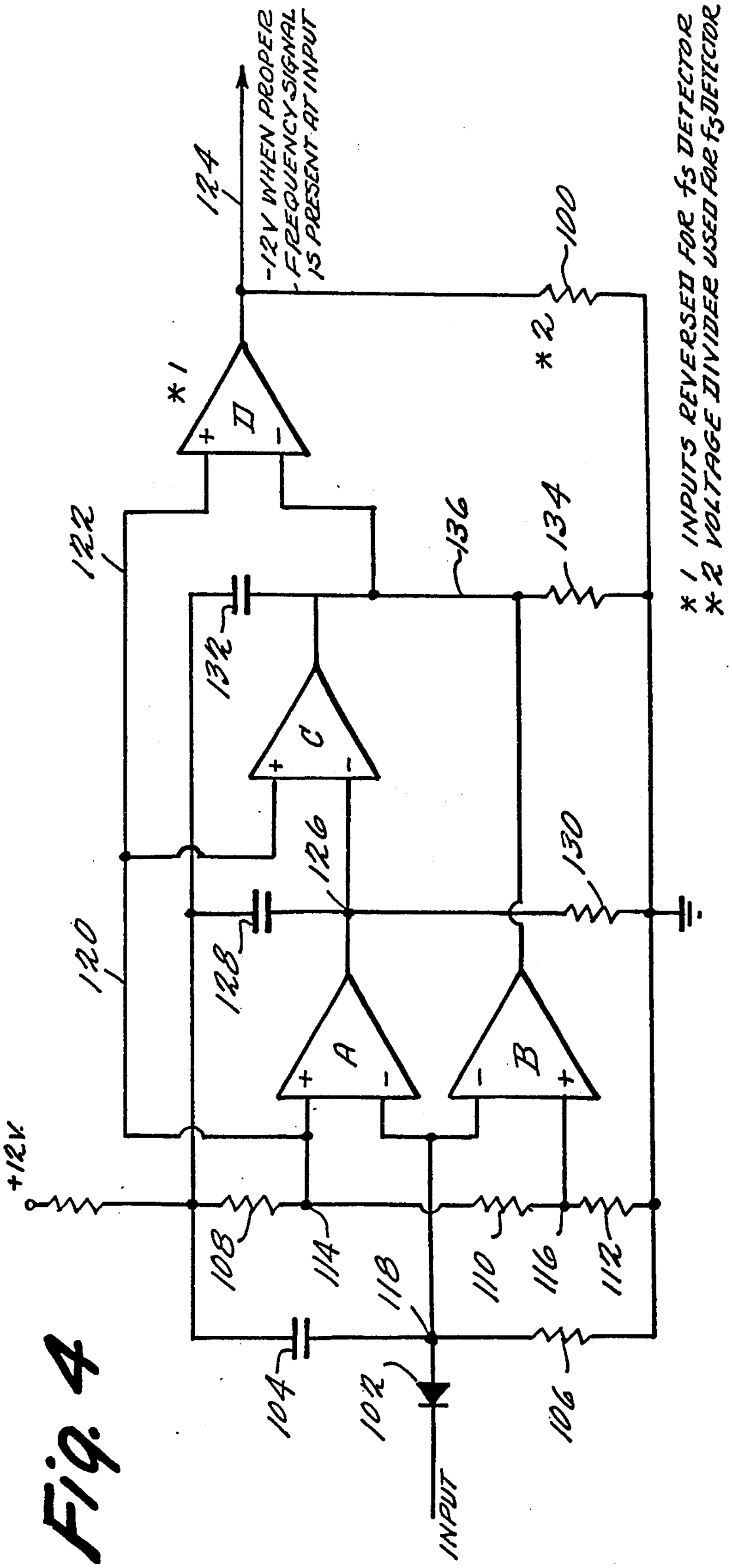
Figure 5:
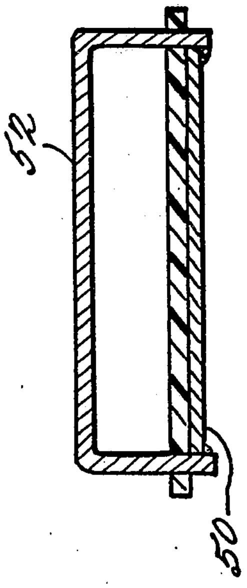

FIG. 4 is a schematic circuit diagram of an exemplary frequency detector according to this invention as utilized in the decoding circuitry of FIG. 3; and FIG. 5 is a schematic depiction of a portion of the RF circuitry and RF antenna utilized with the transmitting and modulating circuitry of FIG. 2. Referring to FIG. 1, the general system in which this invention is employed will be seen to constitute an alarm system for signaling at a central receiving location one of a plurality of possible alarms transmitted thereto by a plurality of remotely located alarm sensing and transmitting units. As shown, there may be a plurality 1 through N of remotely located RF transmitters. In turn, each of such transmitters may have a plurality of alarm inputs 1 through N as shown in FIG. 1. In the most general case, the RF signals transmitted by any given transmitter may be caused to differentiate between the various plurality of alarm inputs thereto. So as to simplify the following discussion, it will be assumed herein that any given RF transmitter unit transmits only a single modulation code. However, as will be appreciated from the following discussion, this exemplary embodiment could be easily modified so as to provide a plural modulation output code from any given RF transmitter so as to distinguish between various alarm inputs.

The electromagnetic fields radiating from the antenna of any given RF transmitter in the system communicate with either or both of the receiving antennas 10, 12. The outputs from such a plurality of receiving antennas are combined and presented to a single channel frequency receiver 14. The receiver 14 is labeled a "space diversity" receiver simply because its input is connected to a plurality of receiving antennas 10, 12 which are located in diverse spatial locations so as to increase the reliability of RF communication between the transmitter and receiver in the system. That is, if one particular transmission path from a particular transmitter to a particular receiving antenna is blocked either temporarily or permanently for some reason, there will then be an alternate RF transmission path from that transmitter to another differently located receiving antenna. Other techniques may be used for achieving such transmission path reliability such as, for instance, frequency diversity transmission systems as further detailed in the aforesaid U.S. Pat. No. 3,757,315.

The RF carrier used for transmitting from the transmitters to the receiver 14 is demodulated within the receiver 14 in the conventional fashion so as to provide at least one output signal component on line 16 corresponding to the modulation that has been imposed on the RF carrier by the RF transmitter unit then transmitting. In the case of the exemplary embodiment, the modulation frequencies employed are within the audio range from approximately 7 kHz to 20 KHz. Accordingly, such modulation signals are from time to time referred to as "audio" signals in the following description.

The thus recovered audio signal on line 16 is presented to a decoder 18 which processes the input audio and provides a corresponding output on one of a plurality of output channels if and only if an appropriate corresponding code has been detected as being present in the input audio signal. In the specific exemplary embodiment shown in FIG. 1, six output channels are shown as eminating from the decoder 18. However, as will be appreciated, the system of this invention may incorporate more or less than the specific number of channels shown in FIG. 1.

Once the alarm outputs have been generated by decoder 18, the output signals on the various channels are then processed in a conventional fashion via elements such as an intrusion processor 20, a fire alarm processor 22 and/or an auxiliary relay board 24 so as to selectively activate alarm indicating and/or action devices such as the sonalert 26, a siren 28, a tape or digital telephone dialing mechanism 30 and/or other external indicating devices. The system of FIG. 1 also includes a conventional front panel 32 having various mode selection and power on-off switches, etc. which cooperate with the processors and with a power supply 34 so as to activate the system in various desired modes of operation.

The novel and unique features of the system shown in FIG. 1 are detailed in FIGS. 2–5.

An exemplary RF transmitter circuit is shown in FIG. 2. Such circuitry includes an RF section 40 and a modulator 42. The crystal 44 oscillates at a submultiple of the carrier frequency in a tuned oscillator circuit comprising the base-emitter circuit of transistor 46. The harmonic of the oscillator frequency corresponding to the desired RF carrier frequency is selected by a tuned circuit comprising tunable inductor 48 and the collector-base circuit of transistor 46. This RF circuitry also includes a ground return portion 50 which will be discussed in greater detail with respect to FIG. 5. The antenna 52 comprises a partial loop of wire (see FIG. 5) overlying a longated conductive area comprising the ground return conductor 50. The antenna circuit is tuned to the desired carrier frequency and is located directly above a portion of the RF circuitry such as the ground portion 50 such that electromagnetic energy having the desired carrier frequency is coupled thereto and radiated therefrom.

The emitter-collector circuit of transistor 54 is connected in parallel across capacitor 56 in the tuned oscillator circuit such that when transistor 54 is turned "on," it alters the oscillation frequency by some predetermined amount. In a typical purely exemplary embodiment, the carrier frequency may be on the order of 300 MHz which represents the fifteenth harmonic of a 20 MHz crystal oscillator frequency. In such exemplary embodiment, the component values may be chosen such that transistor 54 may pull the oscillator frequency down by 20 KHz thereby causing an approximately 300 KHz deviation in the radiated carrier frequency. As will be appreciated, this form of transmitter comprises a form of frequency modulation; however, as will be appreciated, it would also be possible to use amplitude modulation and/or other types of modulation in the overall system of this invention if desired.

Transistor 54 in FIG. 2 is controlled between its "on" and its "off" conditions by the output of comparator 58 which is utilized as an output driving stage for an oscillator comprising comparator 60. The oscillation frequency for comparator 60 is determined by capacitors 62 and 64. Capacitor 62 is shown as permanently connected between ground and the input of comparator 60. Unless capacitor 64 is connected to ground through the output of another comparator 66, it is effectively omitted from the circuit thus leaving only capacitor 62 for determining the oscillation frequency of comparator 60. Under this circumstance, the basic oscillation frequency for oscillator 60 is $f_0$ which might typically be on the order of 20 KHz. However, when comparator 66 switches the other lead of capacitor 64 to ground thus adding that capacitance to that already present from capacitor 62, the oscillation frequency of comparator 60 is shifted to a lower frequency. Depending upon the value of capacitor 64, this lower frequency may be selected to be any one of a plurality of predetermined oscillation frequencies. In a purely exemplary selection, one possible set of such frequencies would be 10, 14 and 7 KHz.

Comparator 66 is utilized as a driver output amplifier for another oscillator section comprising a comparator 68. The frequency of this oscillator is conveniently determined by a parameter value such as the value of feedback resistor 70 which may be chosen to effect a predetermined switching rate such as 150 Hz, 270 Hz, etc.

The various comparators that have been described in this modulator section 42 may comprise operational amplifiers such as may be found on integrated circuits type 3302. The 9 volt power supply to the circuitry shown in FIG. 2 is normally switched into being by an alarm sensor of conventional type. Accordingly, when such an alarm sensor is tripped, the power will be applied to the circuitry shown in FIG. 2 and it will automatically begin transmitting a frequency modulated carrier wherein the modulation occurs normally at a first frequency determined by capacitor 62 but which is repetitively shifted to a second lower frequency as determined by capacitor 64 at a predetermined repetition rate as determined by resistor 70. Of course, the components 64 and 70 would be chosen differently for each RF transmitter in the system of FIG. 1 if desired so that it might be determined after decoding the transmitted signal just exactly where the alarm had originated. Furthermore, a plurality of modulation sections 42 might be selectively and individually switched into operation at a given RF transmitter site by respectively corresponding alarm sensor inputs such that a different coding scheme would be incorporated on that particular transmitter's RF carrier depending upon which alarm sensor input thereto had been tripped. In this instance, the central station would be capable of detecting not only the location of the transmitting alarm but the type of alarm that was tripped at that location in the case where there was more than one type of potential alarm present.

After conventional demodulation in the RF receiver 14, the modulation component of the transmitted RF signal is presented to the input of the decoder shown in FIG. 3. Operational amplifier 80 provides a high gain amplification of the input audio signal whereby insuring that the output is essentially square wave shaped. This square wave form is then differentiated by capacitor C5 and resistors R9, R10 so as to provide a sharp negative going spike for each cycle of the input audio signal. As will be appreciated, the positive going spikes are effectively eliminated by diode CR1. After high gain amplification in operational amplifier 82, such spikes become squared-up pulses of relatively short duration (e.g., 3 microseconds). As will be appreciated from FIG. 3, transistors Q2 and Q3 are turned "on" in response to such short duration pulses so as to deliver a corresponding short negative going input pulse to the frequency detectors $f_0, f_1, f_2$, and $f_3$ as shown in FIG. 3. Transistors $Q_1$, $Q_2$, and $Q_3$ are, in effect a low output impedance driving amplifier for driving the various frequency detectors.

In the illustrative exemplary embodiment, only four frequencies $f_0, f_1, f_2$ and $f_3$ have been depicted. However, as will be appreciated, the number of such modulation frequencies utilized and hence the number of frequency detectors utilized in the decoding circuitry could be less than or greater than that used in the exemplary embodiment if desired. The preferred circuitry for frequency detectors $f_0, f_1, f_2$ and $f_3$ is shown in detail at FIG. 4 and will be described in detail later. However, for the present explanatory purposes, it will be assumed that such frequency detectors are operative to provide a negative voltage level at their outputs whenever the input pulse train has a repetition rate or frequency within a predetermined frequency band corresponding to the four separate possible modulation frequencies in this exemplary system, namely, $f_0$, $f_1$, $f_2$, and $f_3$. It will also be understood that many conventional frequency detector circuits could be utilized as the frequency detector in the decoding circuitry of FIG. 3. However, for optimum performance, it is presently preferred that the circuitry shown in FIG. 4 be utilized as the frequency detector.

As may be seen in FIG. 3, the output from detector $f_0$ is connected through diode CR7 to the positive input of operational amplifier 84 while the outputs of the remaining frequency detectors $f_1$, $f_2$, and $f_3$ are connected through a diode OR gate comprising diodes CR8, CR7, and CR10 to the negative input of operational amplifier 84. Amplifier 84 then operates much like a bistable flip-flop in that it alternates between its two opposite extremes of operation depending upon whether it is receiving an input from detector $f_0$ or from one of the other detectors $f_1$, $f_2$, or $f_3$. As should now be appreciated, whenever the basic modulation frequency $f_0$ is present, the output from the $f_0$ detector will cause a negative level output from amplifier 84. Alternatively, if any of the other three modulation frequencies $f_1$, $f_2$, or $f_3$ are present, the output of operational amplifier 84 will be driven to its positive extreme. With resulting square wave form is differentiated by capacitor C20 and resistor R52 with the resulting positive going spikes being clipped by diode CR9 while the negative going spikes are amplified and squared into relatively short duration pulses (e.g. approximately 200 microseconds) which are then applied to the input of further frequency detectors $f_{s1}$ and $f_{s2}$ as shown in FIG. 3. As should be appreciated, an isolating low output impedance driving amplifier may be inserted between the output of amplifier 86 and the input of the further frequency detectors $f_{s1}$ and $f_{s2}$ if desired. Furthermore, as should also be appreciated, the number of such further frequency detectors employed in the exemplary embodiment is purely for illustrative purposes and it should be clearly understood that different number of such frequency detectors might be employed if desired for a particular application.

The preferred circuitry for the further frequency detectors $f_{s1}$ and $f_{s2}$ is also as shown in FIG. 4 with a couple of minor modifications so as to reverse the polarity of the output signal therefrom. However, as should be appreciated, there are many conventional frequency detector circuits which might also be employed if desired.

With the circuitry of the exemplary embodiment, the outputs from the further detectors $f_{s1}$ and $f_{s2}$ are normally negative level voltage outputs unless and until a pulse train having a repetition rate or frequency within the predetermined frequency select band of that particular detector is presented to its input. Thus, transistors 88 and 90 are normally turned "on" thus holding all of the output channel lines number 1 through number 6 to essentially zero volts. However, if an appropriate pulse train is presented to the input of the further frequency detectors, the selected detector will turn its associated transistor "off" thus allowing three of the output channel lines to take on a negative voltage if one is indeed being applied thereto through one of the resistors R45, R46, R37, R36, R56 or R57 which is connected between respectively associated output channel lines 1 through 6 and the output of the various frequency detectors $f_1$, $f_2$ and $f_3$ as shown in FIG. 3.

As an illustrative example, let it be assumed that the modulation component of the RF signal comprising the audio input to the circuitry of FIG. 3 is being alternately modulated at frequency $f_0$ and frequency $f_2$ with the rate of alternation occurring at a switching frequency of $f_{s1}$. Under these conditions, the output of detectors $f_0$ and $f_2$ will be alternately negative with such alteration occurring at frequency $f_{s1}$. The resulting $f_{s1}$ frequency square wave from amplifier 84 will be shaped into a corresponding train of relatively short output pulses occurring at a rate $f_{s1}$ from amplifier 86 and presented to the input of further detectors $f_{s1}$ and $f_{s2}$ whereupon the output of detector $f_{s1}$ will change from a negative level voltage to an essentially ground potential thereby turning transistor 88 "off." As a result, output channel number 3 will be permitted to swing negative with the output of detector $f_2$ while output channel 4 is still clamped to an essentially ground potential through diode CR18 and transistor 90. All other output channel lines are still at essentially ground potential because of the clamping action of transistor 90 or because of the essentially ground potential of the output at detectors $f_1$ and $f_3$. It should be appreciated that the diode and resistor array directly connected to the output channel lines 1 through 6 is essentially an AND gate for forming the logical intersection of the outputs from frequency detectors $f_1$, $f_2$ and $f_3$ on the one hand with the output of further frequency detectors $f_{s1}$ and $f_{s2}$ on the other hand.

As shown in FIG. 4, the preferred circuitry for the frequency detectors of the decoder shown in FIG. 3 comprises four operational amplifiers A, B, C and D. Preferably, these operational amplifiers are of the type which have a passive open collector transistor output such as that which is available in integrated circuit type 3302. In this type of comparator, the output is actually the only connection to the collector of an output transistor stage. Thus, when this output transistor is turned "on" the output terminal is effectively caused to take on the same potential as the emitter of this transistor. On the other hand, when the output transistor of such a comparator is turned "off" the output collector terminal is simply permitted to float and is not actually forced to take on any particular voltage. In the exemplary embodiment to be explained below, the output transistor emitter is connected to a negative twelve volt supply so that when any particular comparator is caused to take on a negative output, it will effectively clamp the output terminal (the collector of the output transistor) to this −12 volt supply voltage. On the other hand, if the output of one of these comparators should be caused to move toward the other or positive extreme, the output terminal (collector of the output transistor) will simply be effectively disconnected from the negative supply voltage and permitted to float.

As shown in FIG. 4 and as earlier explained, the input to this frequency detector is preferably processed so as to comprise a pulse train of relatively short (e.g., approximately 3 microseconds) pulses. If the pulse repetition rate or frequency of this input pulse train is within a predetermined frequency select band for a particular detector circuitry, then the output from the final comparator D will be clamped to the negative supply voltage as shown in FIG. 4. On the other hand, if the pulse repetition rate of the input is outside the frequency select band for a particular detector circuitry, the output from comparator D will be permitted to float away from the negative supply voltage. Since such output is connected to ground through resistor 100, it follows that the output will in this instance be effectively clamped to ground potential.

As will be explained in more detail, comparators A and B are caused to toggle or not to toggle between their extreme output conditions in dependence upon the pulse repetition rate of the input pulse train. In the exemplary embodiment, comparator A is caused to toggle whenever the input pulse repetition rate is within or below a predetermined frequency select band while comparator B is caused to toggle whenever the input pulse repetition rate is below the frequency select band. Accordingly, when the input pulse repetition rate is within the frequency select band, comparator A is toggling while comparator B is not toggling. The function of the further comparator C and D and their associated RC circuits as shown in FIG. 4 is to detect this condition as well as to detect possible missing pulses in the input pulse train and/or signal interruption.

The negative going input pulse train is applied through diode 102 to an RC input circuit comprising capacitor 104 and resistor 106. The RC time constant of this input circuit is chosen with respect to the desired frequency select band of the circuit such that there is a substantial voltage variation between successive pulse occurrences within this frequency band. Accordingly, when each negative going input pulse is presented to the RC input circuit, the node 118 at the juncture of capacitor 104 and resistor 106 is returned to a predetermined negative level comprising a starting state and then caused to progressively change that state by virtue of the increasing voltage thereat as a function of elapsed time between the successive input pulses.

At the same time, a voltage divider comprising resistors 108, 110 and 112 is provided so as to furnish a first reference voltage at node 114 and a second reference voltage at node 116. The relative values of the resistances in this voltage divider chain are chosen so as to establish the reference levels at nodes 114 and 116 to bracket a corresponding predetermined range of variation of voltage at node 118 in the input RC circuit. As will become apparent from the following discussion, the value of the reference voltages at nodes 114 and 116 determines the frequency select band for any given RC time constant of the input circuit comprising capacitor 104 and resistor 106. Thus, a convenient selection of particular parameters for a particular frequency detecting circuit may be obtained by considering capacitor 104 and resistor 106 to control the center frequency of a frequency select band while the resistor 110 (which determines the spread between the voltages at nodes 114 and 116) may be considered as determining the bandwidth of the frequency select band in terms of percentage of the center frequency for the frequency detector.

For a negative supply voltage as shown in the exemplary embodiment of FIG. 4, it will be appreciated that the voltage at node 116 will be slightly lower than the reference voltage at node 114. It will also be appreciated that the exemplary embodiment as shown in FIG. 4 has one input of comparators A and B connected to monitor the condition of the input RC circuit at node 118 while another input of comprator A is connected to the reference voltage at node 114 and the remaining input of comparator B is connected to monitor the reference voltage at node 116.

If a frequency in excess of the frequency select band for the detector is applied to the input, the voltage at node 118 will be rapidly reset to its negative starting state such that it will never have a chance to reach the lesser negative values needed for transitioning either comparator A or comparator B. Accordingly, in this state, both comparators A and B will remain stable in their non-toggling condition with their output terminals being permitted to float. It follows that comparator C will be driven to a stable negative voltage level output due to the fact that its positive input is connected via lead 120 to monitor the reference voltage at node 114. Comparator D will be driven to its floating output state by virtue of the output from comparator C being applied to its negative input, which negative input is greater in magnitude than the reference voltage applied through line 122 to the positive input of comparator D. Accordingly, under such high frequency conditions, output line 124 will be held at an essentially ground potential by virtue of its connection to ground potential through resistor 100.

If the input pulse train has a repetition rate within the frequency select band, then enough elapsed time will occur between successive input pulses so as to permit the voltage at node 118 to change sufficiently with respect to the reference voltage at node 114 to toggle comparator A but will not be permitted to reach a level sufficient with respect to the reference voltage at node 116 to toggle comparator B. Thus, under these conditions, comparator B is still stable in its non-toggling condition with its output line floating. On the other hand, comparator A is caused to toggle at the input frequency between a floating output condition and an output clamped to the negative 12 volt supply voltage. Thus, node 126 of the RC circuit comprising capacitor 128 and resistor 130 is periodically drawn to the negative supply voltage and then permitted to rise toward ground potential. The time constant of this RC circuit is chosen with respect to the frequency select band of the detector and with respect to the reference voltage supply via line 120 to comparator C such that comparator C is driven to its positive or floating output state and remains stable at such state so long as no pulses are missing from the input pulse train. However, as soon as a missing pulse occurs in the input pulse train, node 128 is permitted to progress towards ground potential until it is less than the reference potential applied to comparator B via node 116 thus causing comparator B to transition to its negative output state.

However, assuming that there are no missing pulses and that the input frequency is within the frequency select band, it should now be appreciated that comparator A is toggling while comparator B is non-toggling at its floating output state while comparator C is also maintained at its floating output state. Thus, comparator D is driven to its clamped negative output state by virtue of the negative reference potential input thereto over a line 122 thus providing a clamped negative level voltage output on line 124. As should now be apparent, if a missing pulse occurs in this input pulse train, the voltage at node 126 will be permitted to rise above the negative reference voltage applied via line 120 thus causing comparator C to transition to its negative clamped output state which, in turn, will drive comparator D to its floating output stage thus permitting the output on line 124 to take on an essentially ground potential.

The capacitor 132 and resistor 134 comprise another RC circuit which is provided for inhibiting an output from the detector until after the passage of some predetermined time period. That is, when there is no frequency present at the input of the detector within the frequency select band, the output from comparator C will be in its negative output state thus causing the voltage at node 136 to take on an essentially negative power supply potential. Whenever an input frequency within the frequency select band is presented, the output from comparator C will transition to its floating output state. While the node 136 will then progress towards ground potential, it will not reach ground potential instantaneously but, rather, will be permitted to progress towards ground potential at a rate determined by the time constant of capacitor 132 and resistor 134. Thus, only after a predetermined time period has elapsed will the voltage at node 136 progress sufficiently toward ground potential so as to permit transitioning of comparator D to its clamped negative output state. Accordingly, the detector of FIG. 4 will provide an output indicating the presence of an appropriate input pulse train only after that pulse train has been present at its input for a predetermined time period.

In the case where the input pulse repetition rate is below the frequency select band, the voltage at node 118 will be permitted to progress toward ground potential sufficiently with respect to the referenced voltages at both nodes 114 and 116 so as to transition both of comparators A and B once each input cycle. While the comparator C will accordingly be caused to take on its non-toggling floating output state, the connection of the output from comparator B to the node 136 and the relatively longer time constant of the capacitor 132 and resistor 134 will cause the voltage at node 136 to be sufficiently negative with respect to the reference voltage coming from line 122 so as to drive comparator D to its floating output state thus permitting the output on line 124 to be essentially ground potential. Accordingly, the output on line 124 is seen to be clamped to the negative supply voltage if and only if the input pulse train has a repetition rate which occurs within the frequency select band to be determined by capacitor 104, resistor 106 and resistors 108, 110 and 112 and only if no extra or missing pulses occur as detected by capacitor 128 and resistor 130 in combination with comparator B and C and additionally, only if a sufficient time period has elapsed as determined by capacitor 132 and resistor 134 since the onset of the appropriate input pulse train.

Essentially the same circuit as that shown in FIG. 4 is utilized for the further frequency detectors $f_{s1}$ and $f_{s2}$ shown in FIG. 3. However, the final comparator D has its inputs reversed so as to provide an essentially ground potential output in response to the input of an appropriate frequency within its frequency select band and to otherwise present a negative clamped level output. This is, of course, so that transistors 88 and 90 will be properly controlled as described heretofore. Furthermore, since transistors 88 and 90 do not require such high voltage levels for control purposes resistor 100 is replaced with a voltage divider and output line 124 is taken off this voltage divider so as to provide a lower level driving signal for controlling transistors 88 and 90. However, the basic operation of the frequency detector is the same as has been previously described with respect to FIG. 4.

As should now be apparent, the frequency detector that has just been described is especially useful in the radio frequency alarm system of this invention since harmonically related frequencies may be utilized without producing false output indications, since even a single missing input pulse may be detected to inhibit false outputs and since outputs are inhibited until after a predetermined time period of an appropriate input pulse train has been detected so as to suppress possible spurious output indications.

While only one specific exemplary embodiment has been described above, those skilled in the art will readily recognize that many variations and modifications in specific features of this exemplary embodiment may be made without in any way departing from the unique and novel features thereof. Accordingly, all such variations and/or modifications are intended to be included within the scope of this invention as defined by the appended claims.

What is claimed is:

1. A frequency detector for detecting the occurrence of a predetermined chosen band of frequencies in an electrical signal component which includes a train of relatively short pulses which may occur at a frequency or repetition rate above, below or within said band of frequencies, said frequency detector comprising:

first and second toggling means connected to receive said signal component and to toggle between two output states at the repetition rate of said short pulses and as a function at the frequency of said one signal component wherein both of said toggling means are caused to toggle or not to toggle at said repetition rate whenever the frequency of said signal component is above or below said predetermined chosen frequency band and wherein only said first toggling means is caused to toggle at said repetition rate whenever the frequency of said one signal component is within said predetermined chosen frequency band, and toggle detecting means connected to said first and second toggling means for detecting the condition wherein only said first toggling means is toggling at said repetition rate and for producing an output in response to such detection thereby indicating the presence of a frequency within said predetermined frequency band in said signal component.

2. A frequency detector as in claim 1 wherein said toggle detecting means includes means for inhibiting said output therefrom until after only said first toggling means has been toggling for a predetermined uninterrupted time period.

3. A frequency detector for detecting the occurrence of a predetermined chosen band of frequencies in an electrical signal component which includes a train of relatively short pulses which may occur at a frequency or repetition rate above, below or within said band of frequencies, said frequency detector comprising:

first and second toggling means connected to receive said signal component and to toggle between two output states as a function of the frequency of said one signal component wherein both toggling said toggline means are caused to toggle or not to toggle whenever the frequency of said signal component is above or below said predetermined chosen frequency band and wherein only said first toggling means is caused to toggle whenever the frequency of said one signal component is within said predetermined chosen frequency band, and toggle detecting means connected to said first and second toggling means for detecting the condition wherein only said first toggling means is toggling and for producing an output in response to such detection thereby indicating the presence of a frequency within said predetermined frequency band in said signal component, said first and second toggling means including:

a first input circuit means connected to receive said signal component and to be returned to a predetermined starting state at the frequency of said one signal component wherein said input circuit means is caused to progressively change its state as a function of elapsed time between such returns to its starting state, a divider circuit means connected to provide first and second predetermined different reference signals which bracket a corresponding predetermined range of variation in the state of said first input circuit means, a first comparator means having one input connected to monitor the state of said first input circuit means and having another input connected to monitor said first reference signal whereby said first comparator means is caused to toggle between two output states whenever the frequency of said one signal component is within or below said predetermined chosen frequency band which band corresponds to said predetermined range of variation in the state of said first input circuit means, and a second comparator means having one input connected to monitor the state of said first input circuit means and having another input connected to monitor said second reference signal whereby said second comparator means is caused to toggle between two output states whenever the frequency of said signal component is below said predetermined chosen frequency band but to otherwise remain stable at a first output state.

4. A frequency detector as in claim 1 wherein said toggle detecting means comprises:

a second input circuit means connected to receive the toggle output from said first comparator means and to be returned to a predetermined starting state at the toggling frequency of said first comparator means wherein said second input circuit means is caused to progressively change its state as a function of elapsed time between such returns to its starting state, means for providing a third reference signal corresponding to a predetermined state of said second input circuit means, third comparator means having one input connected to monitor the state of said second input circuit means and having another input connected to monitor said third reference signal whereby said third comparator means is normally stable in a first output state unless said first comparator means should cease toggling for a predetermined time period whereupon said third comparator means will switch to a second output state, means providing a fourth reference signal, fourth comparator means having one input connected to monitor the outputs of said second and third comparators and another input connected to monitor said fourth reference signal whereby said fourth comparator means provides a first output state when the frequency of said signal component is within said predetermined chosen frequency band and which otherwise provides a second output state.

5. A frequency detector as in claim 4 wherein said toggle detecting means includes means for inhibiting said output therefrom until after only said first toggling means has been toggling for a predetermined uninterrupted time period.

6. A frequency detector as in claim 5 wherein said means for inhibiting includes:

a third input circuit means connected to receive the output of said second and third comparators means and to be returned to a predetermined starting state whenever either of said second and third comparator means change from their first output states wherein said third input circuit means is caused to progressively change its state as a function of elapsed time after being so returned to its starting state.

7. A frequency detector for detecting the occurrence of a predetermined chosen band of frequencies in an electrical signal component which includes a train of pulses which may occur at a frequency or repetition rate above, below or within said band of frequencies, said frequency detector comprising:

a timing circuit connected to receive said train of pulses and to provide a time dependent signal during intervals between individual pulses;

a first comparator connected to compare said time dependent signal with a predetermined first reference signal during intervals between individual pulses and to provide one or the other of two output signals depending upon the relative magnitudes of the compared signals;

a second comparator connected to compare said time dependent signal with a predetermined second reference signal during intervals between individual pulses and to provide one or the other of two output signals depending upon the relative magnitudes of the compared signals; and a detector circuit connected to receive the output signals from said first and second comparators and to provide an output indicating the presence of said band of frequencies as a function thereof.

8. A frequency detector as in claim 7 wherein said detector circuit comprises:

a second timing circuit connected to receive the output of one of said first and second comparators and to provide a second time dependent signal following changes in such output; and a third comparator connected to compare said second time dependent signal with a predetermined reference signal and to provide one or the other of two output signals depending upon the relative magnitudes of the compared signals.

9. A frequency detector as in claim 8 wherein said detector circuit further comprises:

a third timing circuit connected to receive the output of the other of said first and second comparators and to the output of said third comparator and to provide a third time dependent signal following changes in its inputs; and a fourth comparator connected to compare said third time-dependent signal with a predetermined reference signal and to provide one or the other of two output signals depending upon the relative magnitudes of the compared signals.

* * * * *